US006495273B1

United States Patent
Hwang et al.

(10) Patent No.: US 6,495,273 B1
(45) Date of Patent: Dec. 17, 2002

(54) BLUE LIGHT-EMITTING POLYMER PREPARED USING A FLORINATED TETRAPHENYL MONOMER AND AN EL DEVICE MANUFACTURED USING THE POLYMER

(75) Inventors: Do Hoon Hwang, Taejon (KR); Tae Hyoung Zyung, Taejon (KR); Lee Mi Do, Taejon (KR); Hye Yong Chu, Taejon (KR)

(73) Assignee: Electronics and Telecommunications Research Institute

( * ) Notice: Subject to any disclaimer, the term of this patent is extended or adjusted under 35 U.S.C. 154(b) by 0 days.

(21) Appl. No.: 09/396,633

(22) Filed: Sep. 15, 1999

(30) Foreign Application Priority Data

Nov. 17, 1998 (KR) ............................................. 98-49234

(51) Int. Cl.⁷ ......................... H05B 33/14; C09K 11/06; C08G 61/00
(52) U.S. Cl. ........................ 428/690; 428/691; 428/917; 313/504; 313/506; 257/40; 257/103; 252/301.35; 526/220; 526/242; 526/256; 526/259; 526/280; 526/315; 528/244
(58) Field of Search ................................. 428/690, 691, 428/704, 917; 313/504, 506; 257/40, 103; 252/301.35; 526/249, 256, 259, 280, 299, 315, 220, 242; 528/247, 244

(56) References Cited

U.S. PATENT DOCUMENTS 5,247,190 A  9/1993  Friend et al. ................. 257/40
5,376,456 A  12/1994  Cumming et al. ........... 428/457
5,514,878 A  5/1996  Holmes et al. ................ 257/40
6,214,481 B1 *  4/2001  Sakai et al. .................. 428/690

OTHER PUBLICATIONS

Journal of Electronic Materials, Improved Efficiency in Green Polymer Light–Emitting Diodes with Air–Stable Electrodes, vol. 23, No. 6, 1994, pp. 453–458, (No month).
Letters to Nature, Light–emitting diodes based on conjugated polymers, vol. 347, Oct. 11, 1990, pp. 539–541.
Letters to Nature, Efficient light–emitting diodes on polymers with high electron affinities, vol. 365, Oct. 14, 1993, pp. 628–630.

* cited by examiner

Primary Examiner—Marie Yamnitzky
(74) Attorney, Agent, or Firm—Blakely Sokoloff Taylor & Zafman

(57) ABSTRACT

A light-emitting polymer and its preparation method, the polymer being excellent in electron injection and transport ability as well as hole injection and transport ability in an EL device, the EL device manufactured from the polymer being also emittable in the blue emission region, in which the EL device from an inorganic material is not mostly emittable. The light-emitting polymer of the invention is an alternated copolymer having repeated units (arylenevinylene units) excellent in hole injection and transport ability and repeated units (fluorinated tetraphenyl units) excellent in electron injection and transport ability with alternated order, as shown in formula (II). An EL device manufactured from the light-emitting polymer, a fluorinated tetraphenyl derivative of formula (I), which is used as a monomer to prepare the light-emitting polymer, and their preparation methods.

15 Claims, 3 Drawing Sheets

BLUE LIGHT-EMITTING POLYMER PREPARED USING A FLORINATED TETRAPHENYL MONOMER AND AN EL DEVICE MANUFACTURED USING THE POLYMER

FIELD OF THE INVENTION

The present invention relates to a new fluorinated tetraphenyl derivative, a new blue light-emitting polymer prepared using the tetraphenyl derivative as a monomer, an electroluminescence (EL) device manufactured using the polymer and a method for preparing or manufacturing the same. More particularly, the new fluorinated tetraphenyl derivative of the invention is represented as the formula (I) and allows the polymers prepared from it to be excellent in the ability of electron injection and transportation. The light-emitting polymer of the invention is represented as the formula (II) and is prepared by the reaction of the fluorinated tetraphenyl derivative with the compound allowing the polymer to be excellent in the ability of hole injection and transportation. The EL device of the invention is manufactured using the light-emitting polymer.

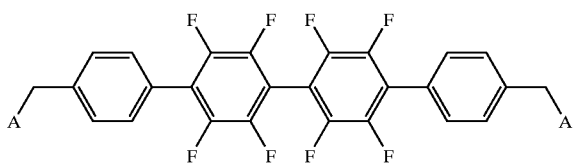

(I)

Here, A is —P(OR)$_2$ or —P$^+$R'$_3$, wherein R and R' is an alkyl group or an aryl group.

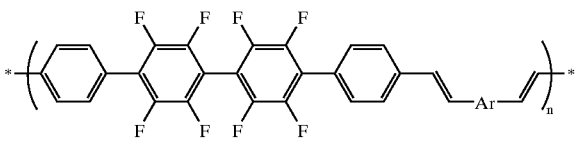

(II)

Here, —Ar— is an arylene group.

DESCRIPTION OF THE PRIOR ART

Generally, as shown in FIG. 1, an EL device is formed by depositing, in turn, a transparent electrode 2, a hole transport layer 3, a polymer light-emitting layer and a metal electrode 6 on a substrate 1. When the transparent electrode 2 and the metal electrode 6 are respectively connected to the (+) terminal and (−) terminal of a power supplier and power is supplied, holes are supplied to the polymer layer 4 through the transparent electrode 2 and hole transport layer 3, electrons are also supplied to the polymer layer 4 through the metal electrode 6 and the electron transport layer 5, and thereby, the holes and the electrons are combined in the polymer layer 4 to result in light emission.

Up to now, generally, π-conjugated polymers such as poly(1,4-phenylenevinylene) (PPV), poly(para-phenylene) (PPP) and polythiophene (PT) are mainly used as light-emitting materials of polymer electroluminescence (EL) devices. Such a π-conjugated polymer is excellent in the abilities of hole injection from the anode and the transport for the injected hole, but is not good in the abilities of electron injection from the cathode and the transport for the injected electron. The majority of the holes injected from the anode could not combine with the electrons injected from the cathode, which flow to the cathode. Therefore, the light emission efficiency of the EL device using the above polymer material as the emitting layer is very low, for the low combination probability of the holes with electrons.

For example, U.S. Pat. No. 5,247,190 discloses conductive polymers, poly(1,4-phenylenevinylene) and its derivatives as a light-emitting material.

U.S. Pat. No. 5,514,878 also discloses a method for enhancing the efficiency of a light-emitting device. In the patent document, the light-emitting device is manufactured using a light-emitting polymer containing a high electron affinity group, cyanide (CN) group and electrons are easily injected from the metal electrode (cathode) in the device, thereby, the combination probability of hole with electron is enhanced.

U.S. Pat. No. 5,376,456 also discloses a copolymer comprised of phenylenevinylene units and two benzene group containing units, wherein the benzene group is substituted with trifluoromethyl group.

However, the devices as described above are mostly not good in the electron injection and transport ability and thus, the holes injected from the anode flow to the cathode without combination with the electrons, that is, the combination probability of hole with electron is not sufficient.

Therefore, the device of the prior art is not sufficient in the light emission efficiency.

SUMMARY OF THE INVENTION

It is, therefore, an object of the present invention to provide fluorinated tetraphenyl derivatives and methods for preparing the same. Wherein the tetraphenyl derivative can be used as a monomer to prepare the light-emitting polymer excellent in electron injection and transport ability.

It is another object of the present invention to provide light-emitting polymers, with which the EL devices are excellent in electron injection and transport ability as well as in hole injection and transport ability and are light-emittable in the blue emission region, in which the EL device with inorganic material is not light-emittable. The light-emitting polymer of the invention is an alternated copolymer having, in alternated order, repeated units excellent in hole injection and transport ability and repeated units excellent in electron injection and transport ability. The present invention also provides methods for preparing the polymers.

It is also another object of the present invention to provide an EL device which is excellent in electron injection and transport ability as well as in hole injection and transport ability and is light-emittable in the blue emission region. The EL device of the invention is manufactured using the light-emitting polymer.

In accordance with one embodiment of the present invention, there are provided fluorinated tetraphenyl derivatives which are represented as the following formula (I).

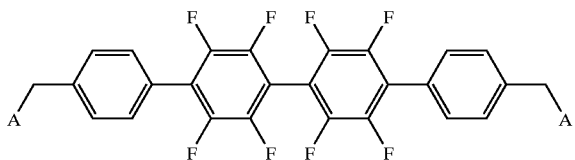

(I)

Here, A is —P(OR)$_2$ or —P$^+$R'$_3$, wherein R and R' is an alkyl group or an aryl group. Preferably, A is —P(OCH$_2$CH$_3$)$_2$ or —P$^+$(C$_6$H$_5$)$_3$.

In accordance with another embodiment of the present invention, there are provided light-emitting polymers which are represented as the following formula (II).

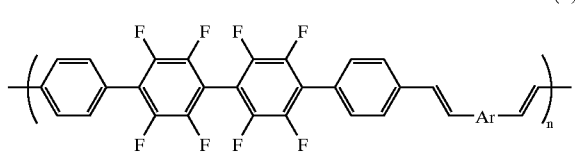

(II)

Here, —Ar— is an arylene group and n is 5–100. Preferably, —Ar— is selected from a group consisting

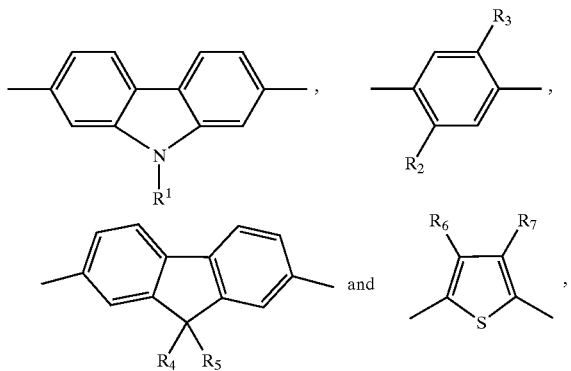

wherein R$_1$, R$_4$, R$_5$, R$_6$ and R$_7$ are separately hydrogen or linear or branched C$_1$–C$_{20}$ alkyl group having 1–20 carbons, and R$_2$ and R$_3$ are separately hydrogen or linear or branched alkyl or alkoxy group having 1–20 carbons.

In accordance with another embodiment of the present invention, there are provided EL devices containing a polymer light-emitting layer formed with the light-emitting polymer.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
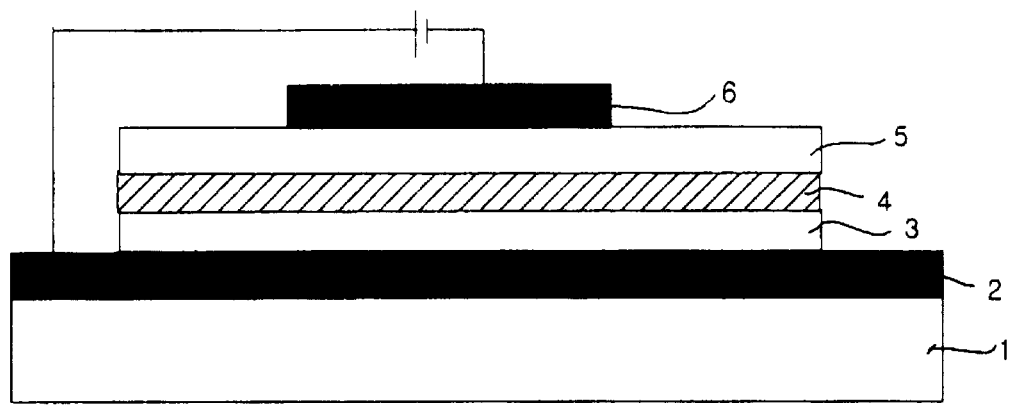
FIG. 1 is a sectional view of a typical EL device.

The invention will be illustrated in detail by the following preferred embodiments with reference to the accompanying drawings.

The fluorinated tetraphenyl derivative of the formula (I) can be used as a monomer to prepare the light-emitting polymer of the formula (II). The EL device of the invention can be manufactured using the light-emitting polymer. The light-emitting layer of the device is formed with the polymer. Therefore, the present invention provides the fluorinated tetraphenyl derivatives, the light-emitting polymers and the EL devices. The invention also provides methods for preparing or manufacturing them as described below.

The light-emitting polymer has the alternately repeated structure constructed with four para-phenylene units fluorinated and arylenevinylene units. Among the four phenylene groups the two middle phenylene groups are fully fluorinated, but the rest are not fluorinated. The tetraphenyl unit is substituted by fluorines and is high in electron affinity. It is considered that its electron affinity comes from the fluorine substituents. So, the fluorinated tetraphenyl unit allows electrons to be easily injected from the metal electrode (cathode) and to be transported. It is also excellent in endurance against heating and photo-oxidation. While, the arylene unit such as phenylenevinylene, carbazolevinylene and fluorenevinylene is excellent in hole injection and transport ability.

The light-emitting polymer of the invention increases the forming probability of exciton produced by the combination of the electron and hole transported from the cathode and anode, respectively. Accordingly, the light emission efficiency is greatly enhanced in the EL device of the invention manufactured using the light-emitting polymer of the invention. The EL device of the invention is also light emittable in the blue emission region, in which the EL device manufactured using inorganic material is not so.

The fluorinated tetraphenyl derivative of the invention can be prepared by a process as shown in the scheme (I) below. Wherein, the fluorinated bis(halomethyl)tetraphenyl derivative reacts with trialkyl or triaryl phosphite or trialkyl or triaryl phosphine and thus, the halogen group of the tetraphenyl derivative is substituted to phosphonate or phosphonium salt. The tetraphenyl derivative can be used as a monomer to prepare the light-emitting polymer, which is a n-conjugated copolymer in the main chain and is prepared by the Wittig Reaction or Horner Reaction of the tetraphenyl derivative with arylenedialdehyde.

Scheme (I)

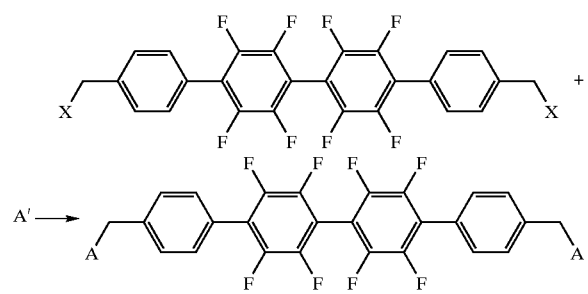

In the scheme (I), X is halogen group, A' is P(OR)$_3$ or PR'$_3$, and A is —P(OR)$_2$ or —P$^+$R'$_3$. Wherein, R and R' are alkyl or aryl group, separately. Preferably, X is bromide, A' is P(OEt)$_3$ or P(C$_6$H$_5$)$_3$, and A is —P(OEt)$_2$ or —P$^+$(C$_6$H$_5$)$_3$.

For example, 1,22-bis(bromomethyl)-8,9,11,12,14,15,17,18-octafluorotetraphenyl reacts with triethyl phosphite or triphenyl phosphine to produce the fluorinated tetraphenylene derivative.

Meanwhile, the bis(bromomethyl)tetraphenyl, which is a reactant for preparing the fluorinated tetraphenyl derivative of the invention, can be prepared as described in the scheme (II).

Scheme (II)

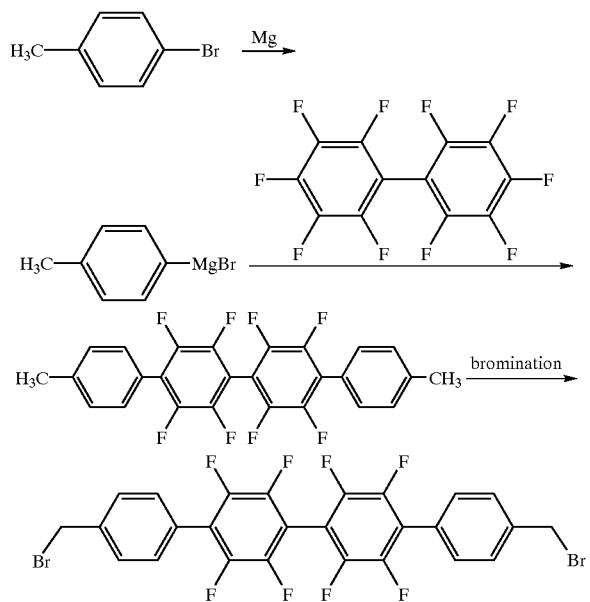

As shown in the Scheme (II), 4-bromotoluene is reacted with magnesium to produce a Grignard reagent, 4-toluyl magnesium bromide, which is then Grignard-reacted with decafluorobiphenyl to obtain 1,22-dimethyl-8,9,11,12,14,15,17,18-octafluoro tetraphenyl, which is then reacted with a bromination reagent such as N-bromosuccineimide to obtain 1,22-bis(bromomethyl)-8,9,11,12,14,15,17,18-octafluorotetraphenyl.

The light-emitting polymer of the invention can be prepared by polymerization reaction of the fluorinated tetraphen-yl derivative of the invention as a monomer with arylene-dialdehyde as the other monomer, in which two aldehyde groups are introduced to arylene such as carbazole, phenyl, fluorene and thiophene. By the polymerization, the tetraphenyl group is bound with the arylene group through vinyl group to produce n-conjugation in the polymer main chain. This is represented in the scheme (III).

Scheme (III)

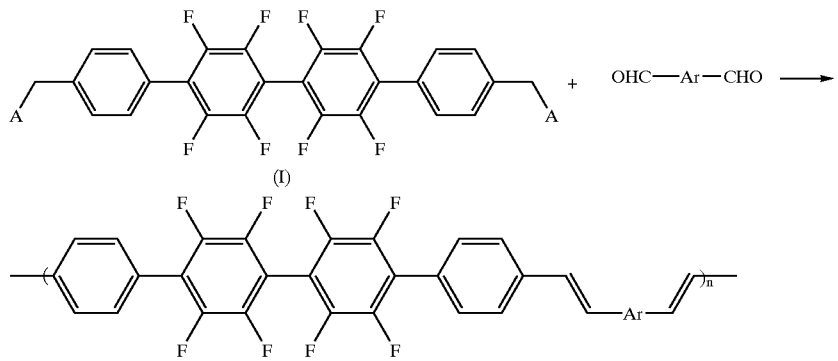

In the scheme (III), —Ar— is arylene group, and A is —P(OR)$_2$ or —P$^+$R'$_3$, n is 5–100. Wherein, R and R' is alkyl or aryl group separately. Preferably, —Ar— is selected from a group consisting of

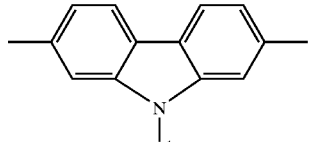

and

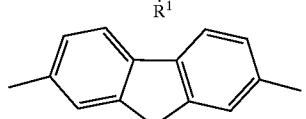

wherein R$_1$, R$_4$, R$_5$, R$_6$ and R$_7$ are separately hydrogen or linear or branched alkyl group having 1–20 carbons, and R$_2$ and R$_3$ are separately hydrogen or linear or branched alkyl or alkoxy group having 1–20 carbons. More preferably, R$_1$ is 2-ethylhexyl group, R$_2$ is methoxy group, R$_3$ is (3,7-dimethyl)octyloxy group, and R$_4$ and R$_5$ are hexyl group separately.

Particularly, specific examples for synthesizing the light-emitting polymer of the invention are described in the schemes below.

As shown in the scheme (IV), ({4-[4-(4-{4-[(diethoxyphosphino)methyl]phenyl}-2,3,5,6-tetrafluorophenyl)-2,3,5,6-tetrafluorophenyl]phenyl}methyl)diethoxyphosphine (formula M-1) is reacted with 3,6-diformyl-9-(2-ethylhexyl)carbazole (formula M-2-1) by Horner reaction to produce the light-emitting polymer P-1.

Scheme (IV)
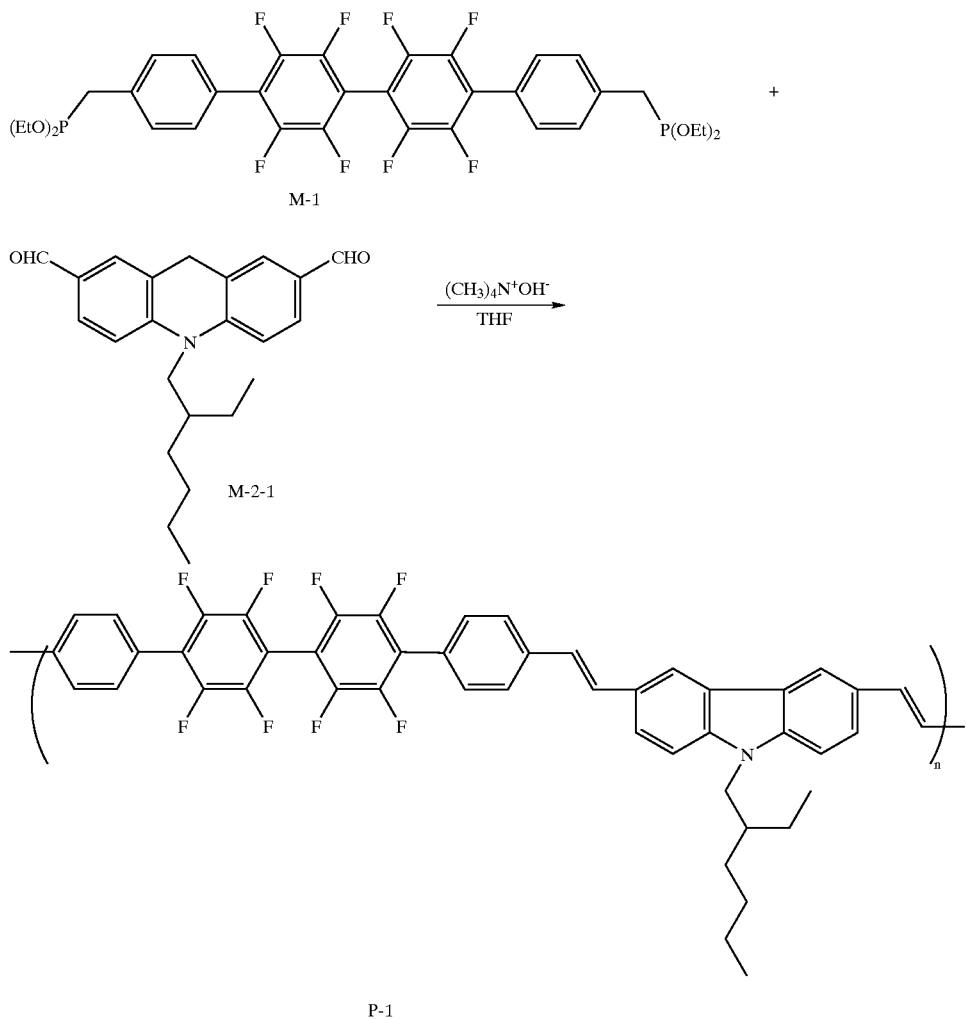
Also as shown in the scheme (V), ({4-[4-(4-{4-[(diethoxyphosphino)methyl]phenyl}-2,3,5,6-tetrafluorophenyl)-2,3,5,6-tetrafluorophenyl]phenyl}methyl)diethoxyphosphine (formula M-1) is reacted with 2-methoxy-5-(3,7-dimethyl)octyloxy-1,4-dialdehyde (formula M-2-2) by Horner reaction to produce the light-emitting polymer P-2.
Scheme (V)
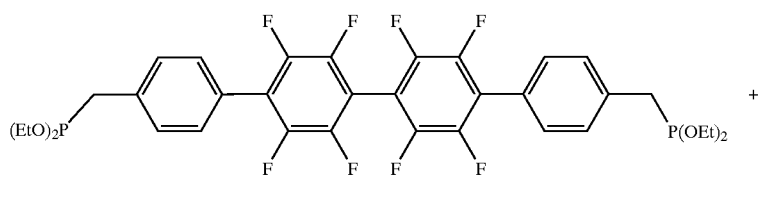

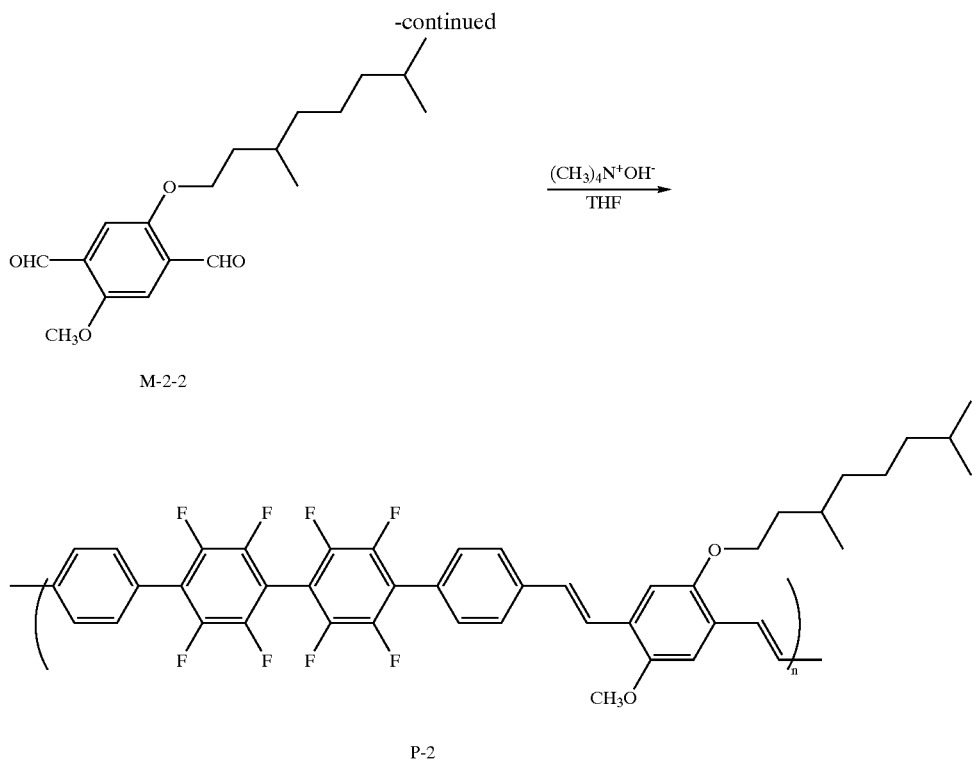
Also as shown in the scheme (VI), ({4-[4-(4-{4-[(diethoxyphosphino)methyl]phenyl}-2,3,5,6-tetrafluorophenyl)-2,3,5,6-tetrafluorophenyl]phenyl}methyl)diethoxyphosphine (formula M-1) is reacted with 9,9-dihexylfluorene-2,7-dicarbaldehyde (formula M-2-3) by Horner reaction to produce the light-emitting polymer P-3.
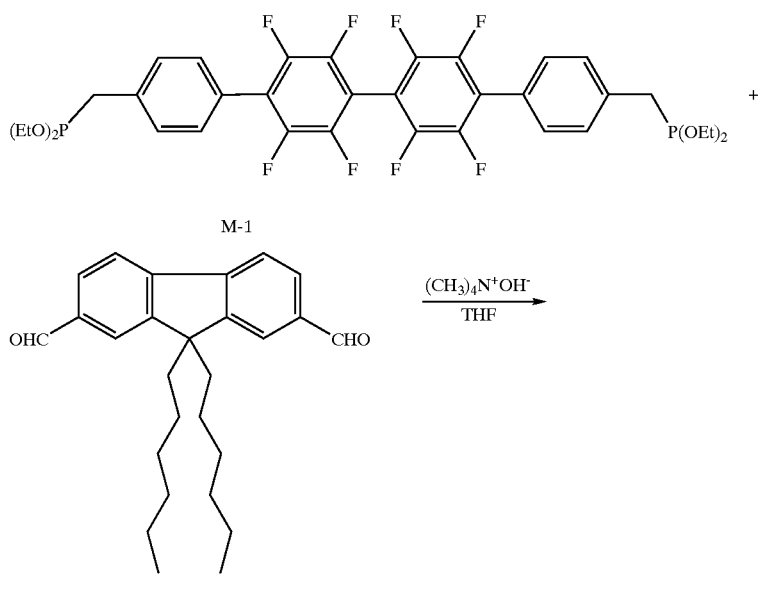

-continued

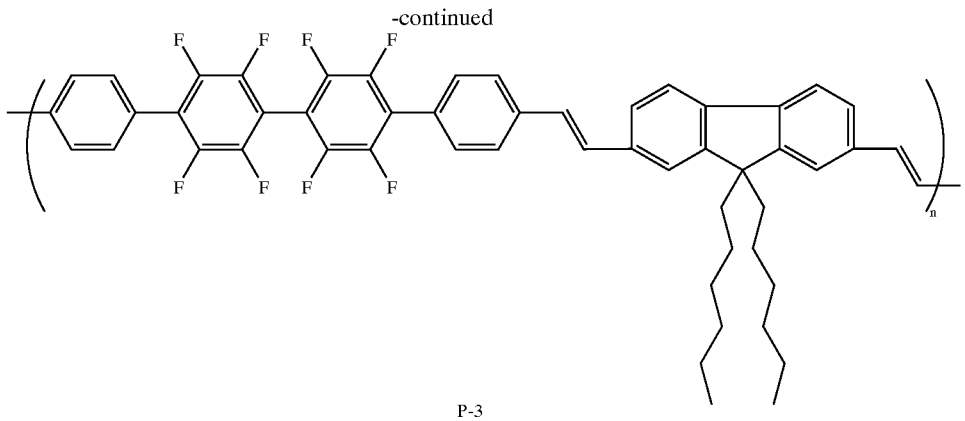

P-3

The light-emitting polymer of the invention has fluorinated tetraphenyl units and arylenevinylene units alternating-repeated. In the polymer of the invention, the fluorinated tetraphenyl units enable electrons to be easily injected and transported due to the high electron affinity of the substituted fluorine. The arylenevinylene units also enable holes to be easily injected and transported.

The EL device of the invention can be manufactured by forming its polymer light-emitting layer with the light-emitting polymer of the invention. Here, the polymer light-emitting layer may be formed only with the light-emitting polymer of the invention, or with blending of the light-emitting polymer of the invention with electron or hole transport polymer such as polyvinylcarbazole (PVK).

The EL device of the invention may be a single layer EL device, which comprises, in turn, a transparent electrode, a polymer light-emitting layer formed using the polymer of the invention and a metal electrode on a substrate. The EL device of the invention may also be a multiple layer EL device, which comprises, in turn, the transparent electrode, a hole transport layer, the polymer light-emitting layer, an electron transport layer and the metal electrode.

Now, the invention will be described in detail by the examples below, which are provided only for the illustration of the invention, but without limiting the scope of the invention.

EXAMPLE 1

Preparation of 1,22-dimethyl-8,9,11,12,14,15,17,18-octafluorotetraphenyl 15.4 g (90 mmol) of 4-bromotoluene dissolved in 20 mL of anhydrous THF was slowly added with syringe to the flask containing 3.3 g (135 mmol) of clean magnesium pieces and 10 mL of anhydrous THF. At this, the temperature of the flask was adjusted to about 100° C. After 3 hours, the generated Grignard reagent solution in the flask was slowly added with syringe to the other flask containing 10.0 g (30 mmol) of decafluorobiphenyl dissolved in 100 mL of anhydrous THF. After reflux for about 24 hours, the reaction was terminated with precipitation of the reaction product in mixed solvent of water and methanol. The precipitation was then filtered and dried to produce gray solid compound. The resultant compound was washed several times with methanol and purified to obtain 12.9 g of clean white solid product (yield: 90%).

$^1$H-NMR (CDCl$_3$, ppm): _2.42 (s, 6H), 7.37 (m, 8H)

EXAMPLE 2

Preparation of 1,22-bis(bromomethyl)-8,9,11,12,14,15,17,18-octafluorotetraphenyl 9.3 g (19.44 mmol) of 1,22-dimethyl-8,9,11,12,14,15,17,18-octafluorotetraphenyl, 7.3 g (40.82 mmol) of N-bromosuccineimide and a little amount of peroxybenzoic acid were added into 100 mL of carbon tetrachloride. The reaction mixture was refluxed for 5 hours. After completion of the reaction, the succineimide floated on the surface of the reaction mixture solution was filtered to remove and the solvent was removed by rotary evaporator. The resultant solid compound was washed with methanol, filtered and dried in vacuum oven to obtain 7.9 g of white solid product. Yield: 64%.

$^1$H-NMR (CDCl$_3$, ppm): _4.54 (s, 4H), 7.53 (m, 8H)

EXAMPLE 3

Preparation of ({4-[4-(4-{4-[(diethoxy phosphino) methyl]phenyl}-2,3,5,6-tetrafluorophenyl)-2,3,5,6-tetrafluorophenyl]phenyl}methyl)diethoxyphosphine (formula M-1)

7.9 g (12.4 mmol) of 1,22-bis(bromomethyl)-8,9,11,12,14,15,17,18-octafluorotetraphenyl was reacted with an excess amount of triethyl phosphate at 100~120° C. for 24 hours. After this, 50 mL of methanol was added to the reaction vessel to form precipitation. The precipitation was then filtered, washed several times with methanol, and dried in vacuum oven for a day to obtain 8.0 g of white solid product (yield: 90%).

$^1$H-NMR (CDCl$_3$, ppm): _1.25 (t, 12H), 3.22 (d, 4H), 4.01 (q, 8H), 7.47 (s, 8H)

EXAMPLE 4

Preparation of the light emitting polymer P-1

0.5 g (0.7 mmol) of ({4-[4-(4-{4-[(diethoxy phosphino)methyl]phenyl}-2,3,5,6-tetrafluorophenyl)-2,3,5,6-tetrafluorophenyl]phenyl}methyl)diethoxyphosphine (formula M-1) was dissolved into 15 mL of anhydrous THF with 0.27 g (0.7 mmol) of 3,6-diformyl-9-(2-ethylhexyl)-carbazole (formula M-2-1). After 1.2 mL of 25% tetramethyl ammonium hydroxide in methanol was slowly added into the monomer solution with syringe, the monomers were reacted with each other at room temperature for 48 hours. After completion of the reaction, the reaction mixture was added into the mixed solvent of water and methanol to precipitate, filtered, washed several times with methanol and dried under vacuum for a day to obtain 360 mg of the target polymer (yield: 66%).

EXAMPLE 5

Preparation of the light-emitting polymer P-2

0.5 g (0.7 mmol) of ({4-[4-(4-{4-[(diethoxy phosphino)methyl]phenyl}-2,3,5,6-tetrafluorophenyl)-2,3,5,6- tetrafluorophenyl]phenyl}methyl)diethoxyphosphine (formula M-1) was dissolved into 15 mL of anhydrous THF with 0.22 g (0.7 mmol) of 2-methoxy-5-(3,7-dimethyl) octyloxy-1,4-dialdehyde (formula M-2-2). After 1.2 mL of 25% tetramethyl ammonium hydroxide in methanol was slowly added into the monomer solution with syringe, the monomers were reacted with each other at room temperature for 48 hours. After completion of the reaction, the reaction mixture was added into the mixed solvent of water and methanol to precipitate, filtered, washed several times with methanol and dried under vacuum for a day to obtain 460 mg of the target polymer (yield: 86%).

EXAMPLE 6

Preparation of the light-emitting polymer P-3

0.5 g (0.7 mmol) of ({4-[4-(4-{4-[(diethoxy phosphino) methyl]phenyl}-2,3,5,6-tetrafluorophenyl)-2,3,5,6-tetrafluorophenyl]phenyl}methyl)diethoxyphosphine (formula M-1) was dissolved into 15 mL of anhydrous THF with 0.27 g (0.7 mmol) of 9,9-dihexylfluorene-2,7-dicarbaldehyde (formula M-2-3). After 1.2 mL of 25% tetramethyl ammonium hydroxide in methanol was slowly added into the monomer solution with syringe, the monomers were reacted with each other at room temperature for 48 hours. After completion of the reaction, the reaction mixture was added into the mixed solvent of water and methanol to precipitate, filtered, washed several times with methanol and dried under vacuum for a day to obtain 520 mg of the target polymer (yield: 90%).

The synthesized polymers P-1, P-2 and P-3 were all dissolved into the common organic solvents and spin-coated to form uniform thin film.

The molecular weights of the prepared polymers were measured by using GPC. The mass average molecular weights were in the range of about 5,000~35,000 (n=5~50) and polydispersity indices of the polymers were about 3.0.

Figure 2:
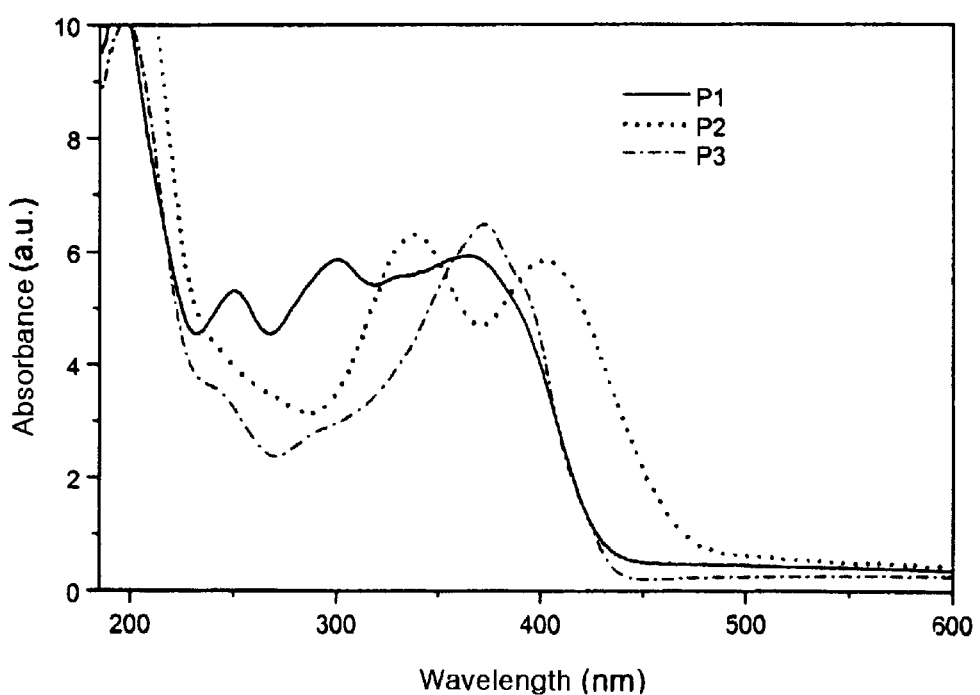
FIG. 2 is a graph showing UV absorption spectra of the light emitting polymers prepared according to the example 4 to 6.

FIG. 2 shows the UV absorption spectra of the prepared polymers, P-1, p-2 and p-3. As shown in FIG. 2, the polymer P-1 has maximum UV absorption at 250 nm, 301 nm and 367 nm, and has absorption edge at about 440 nm. The polymer P-2 has maximum UV absorption at 338 nm and 400 nm, and has absorption edge at about 470 nm. The polymer P-3 has maximum UV absorption at 372 nm and has absorption edge at about 440 nm.

Figure 3:
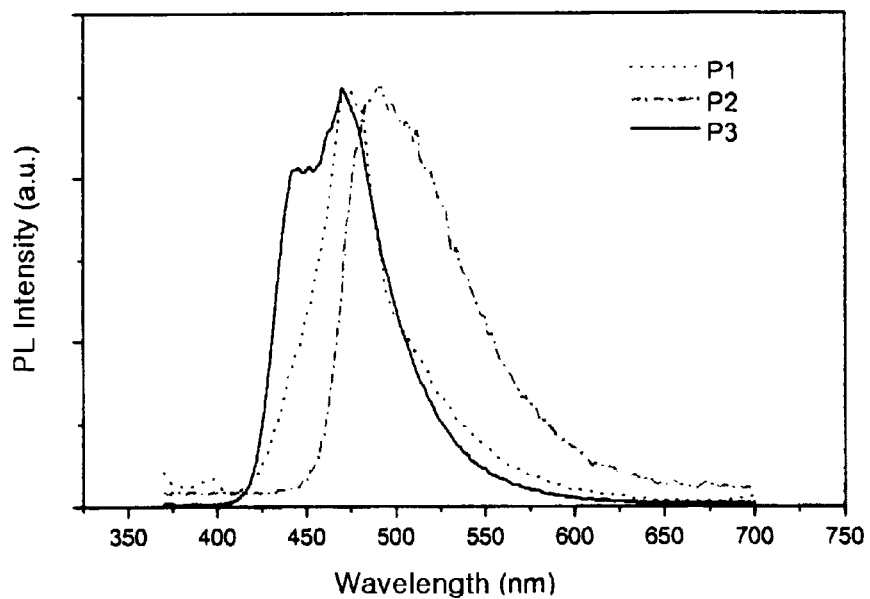
FIG. 3 is a graph showing PL light-emitting spectra of the light-emitting polymers prepared according to the example 4 to 6.
Figure 4:
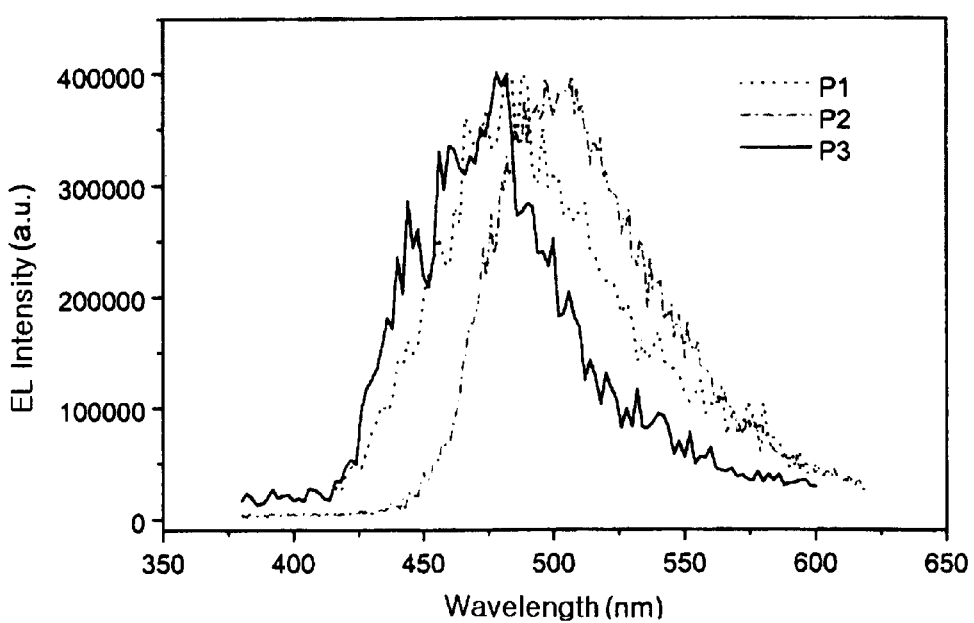
FIG. 4 is a graph showing EL light-emitting spectra of the light-emitting polymers prepared according to the example 4 to 6.

FIG. 3 shows PL spectra of the prepared polymers and FIG. 4 show EL spectra of the polymers. The polymer P-1 has maximum light emission at 473 nm of blue light emission region. The polymer P-2 has it at 490 nm of blue-green region. The polymer P-3 has it at 444 nm and 470 nm of blue region.

Figure 5:
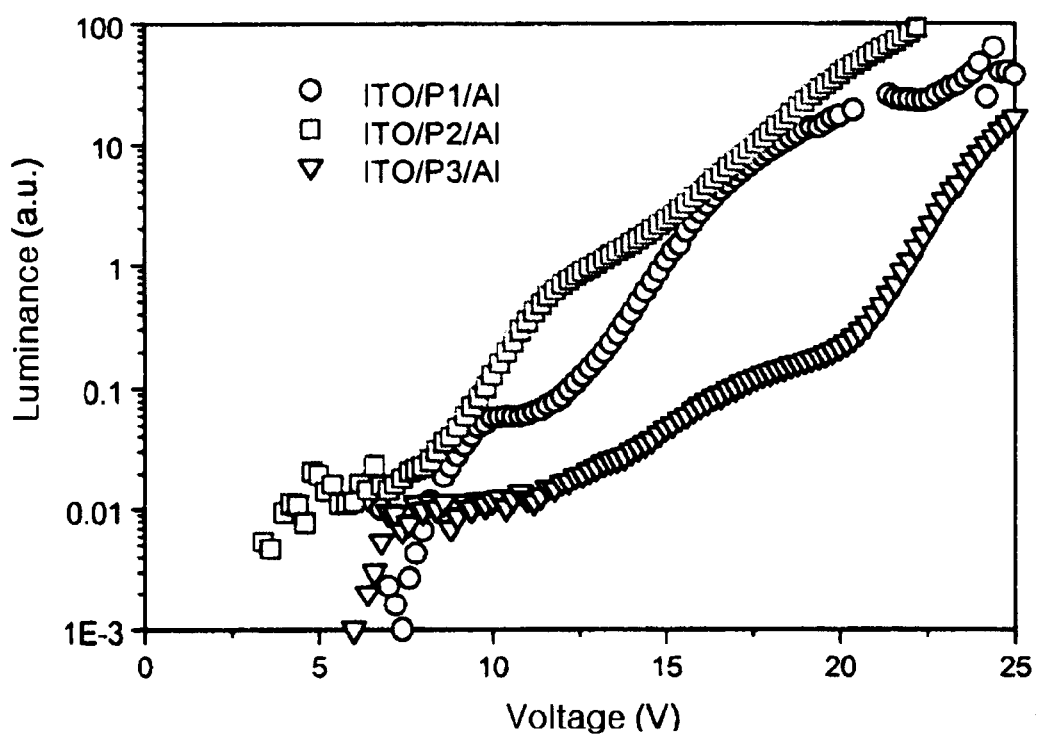
FIG. 5 is a graph showing the voltage versus light emission intensity of the single layer EL device using the light-emitting polymers prepared according to the example 4 to 6.

Single layer EL devices were manufactured with a light-emitting layer respectively formed from the polymers P-1, P-2 and P-3, and electrodes of aluminum and ITO. As shown in FIG. 5, the manufactured devices had the typical diode property that the current increased with increase of the input voltage.

While the present invention has been described with respect to certain preferred embodiments only, other modifications and variations may be made without departing from the spirit and scope of the present invention as set forth in the following claims.

What is claimed is:

1. A light-emitting polymer represented as the formula (II),

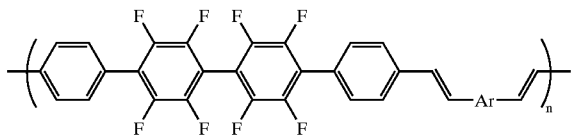

wherein, —Ar— is an arylene group and n is 5–100.

2. The light-emitting polymer according to claim 1, wherein, —Ar— is selected from a group consisting of

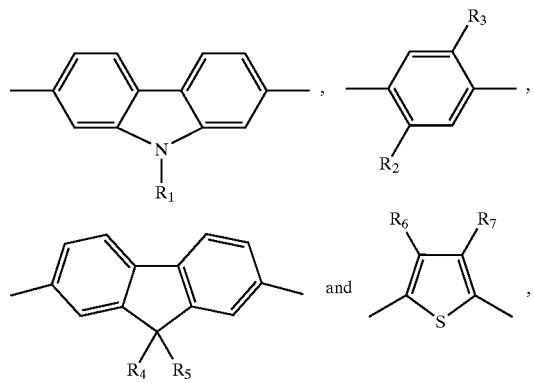

wherein $R_1$, $R_4$, $R_5$, $R_6$ and $R_7$ are separately hydrogen or linear or branched alkyl group having 1–20 carbons, and $R_2$ and $R_3$ are separately hydrogen or linear or branched alkyl or alkoxy group having 1–20 carbons.

3. The light-emitting polymer according to claim 2, wherein $R_1$ is 2-ethylhexyl group, $R_2$ is methoxy group, $R_3$ is (3,7-dimethyl)octyloxy group and $R_4$ and $R_5$ are hexyl group separately.

4. A method for preparing a light-emitting polymer according to claim 1, the method comprising the step of:

reacting a tetraphenyl derivative of the formula (I) with dialdehyde compound according to scheme (III) to obtain the light-emitting polymer, Scheme (III)

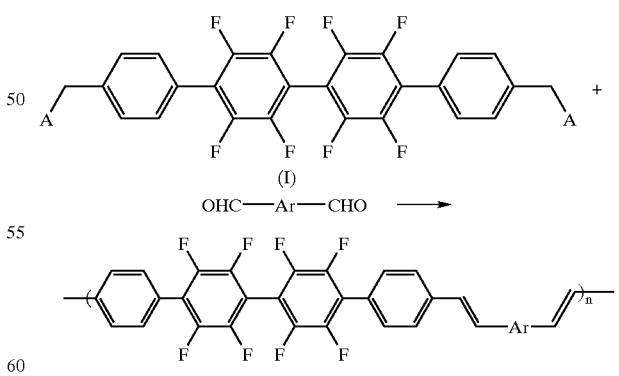

wherein, —Ar— is an arylene group, n is 5–100, and A is —P(OR)$_2$ or —P$^+$R'$_3$, wherein, R and R' is alkyl or aryl group separately.

5. The method for preparing the light-emitting polymer according to claim 4, wherein, —Ar— is selected from a group consisting of

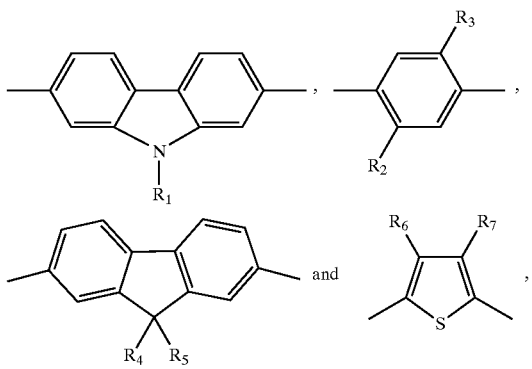

wherein $R_1$, $R_4$, $R_5$, $R_6$ and $R_7$ are separately hydrogen or linear or branched alkyl group having 1–20 carbons, and $R_2$ and $R_3$ are separately hydrogen or linear or branched alkyl or alkoxy group having 1–20 carbons.

6. The method for preparing the light-emitting polymer according to claim 4, wherein tetramethyl ammonium hydroxide is used as a base.

7. An EL device containing a pair of electrodes and a polymer light-emitting layer formed with the polymer of claim 1.

8. The EL device according to claim 7, wherein the device is a single layer EL device in which a transparent electrode, the polymer light-emitting layer and a metal electrode are, in turn, formed on a substrate.

9. The EL device according to claim 7, wherein the device is a multiple layer EL device in which a transparent electrode, a hole transport layer, the polymer light-emitting layer, an electron transport layer and a metal electrode are, in turn, formed on a substrate.

10. The EL device according to claim 7, wherein the polymer light-emitting layer is formed with blending of the polymer with at least one of electron or hole transport polymers.

11. The EL device according to claim 10, wherein the transport polymer is polyvinylcarbazole (PVK).

12. An EL device containing a pair of electrodes and a polymer light-emitting layer formed with the polymer of claim 2.

13. The EL device according to claim 12, wherein the device is a single layer EL device in which a transparent electrode, the polymer light-emitting layer and a metal electrode are, in turn, formed on a substrate.

14. The EL device according to claim 12, wherein the device is a multiple layer EL device in which a transparent electrode, a hole transport layer, the polymer light-emitting layer, an electron transport layer and a metal electrode are, in turn, formed on a substrate.

15. The EL device according to claim 12, wherein the polymer light-emitting layer is formed with blending of the polymer with at least one of electron or hole transport polymers.

* * * * *